US008928376B2

(12) United States Patent
Kwak (10) Patent No.: US 8,928,376 B2
(45) Date of Patent: *Jan. 6, 2015

(54) SYSTEM AND METHOD FOR AN ACCURACY-ENHANCED DLL DURING A MEASURE INITIALIZATION MODE (71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/736,857

(22) Filed: Jan. 8, 2013

(65) Prior Publication Data

US 2013/0127506 A1   May 23, 2013

Related U.S. Application Data (63) Continuation of application No. 12/699,638, filed on Feb. 3, 2010, now Pat. No. 8,350,607, which is a continuation of application No. 11/588,954, filed on Oct. 27, 2006, now Pat. No. 7,671,648.

(51) Int. Cl.
H03L 7/06 (2006.01)
H03L 7/081 (2006.01)
G11C 7/10 (2006.01)
H03L 7/08 (2006.01)
G11C 7/22 (2006.01)

(52) U.S. Cl.
CPC ............ H03L 7/0802 (2013.01); H03L 7/0818 (2013.01); G11C 7/1072 (2013.01); H03L 7/0814 (2013.01); G11C 7/222 (2013.01)
USPC ............................. 327/158; 327/156; 327/159

(58) Field of Classification Search
USPC ...................... 327/156, 158, 159; 331/25, 34; 375/373, 375, 376
See application file for complete search history.

(56) References Cited

U.S. PATENT DOCUMENTS

| 6,060,928 | A | 5/2000 | Jun et al. |
| 6,100,735 | A | 8/2000 | Lu |
| 6,313,675 | B1 | 11/2001 | Naffziger |
| 6,546,530 | B1 | 4/2003 | Dreps et al. |
| 6,573,771 | B2 * | 6/2003 | Lee et al. ................ 327/158 |
| 6,661,265 | B2 | 12/2003 | Partsch et al. |
| 6,674,314 | B2 | 1/2004 | Takai |
| 6,765,976 | B1 | 7/2004 | Oh |
| 6,768,361 | B2 | 7/2004 | Kwak |
| 6,774,691 | B2 | 8/2004 | Han et al. |

(Continued)

Primary Examiner — Long Nguyen
(74) Attorney, Agent, or Firm — Dorsey & Whitney LLP (57) ABSTRACT A clock generator having a delay locked loop and a delay control circuit. The delay locked loop receives an input clock signal and adjusts an adjustable delay circuit to generate an output clock signal that is synchronized with received input clock signal. The delay control circuit coupled to the delay locked loop generates a control signal to initialize the delay measure operation to adjust the adjustable delay circuit, after comparing the phase difference of the input clock signal and the output clock signal. The delay control circuit further generates a start measure control signal to start measuring a delay applied to the measurement signal propagating through the adjustable delay circuit, and generates a stop measure control signal to stop the delay measurement of the measurement signal. The delay adjustment of the delay locked loop is then adjusted to apply the delay measurement when synchronizing the input and output clock signals.

20 Claims, 6 Drawing Sheets

(56) References Cited

U.S. PATENT DOCUMENTS

| | | |
|---|---|---|
| 6,795,931 B1 | 9/2004 | Laberge |
| 6,826,247 B1 | 11/2004 | Elliott et al. |
| 6,868,504 B1 | 3/2005 | Lin |
| 6,911,853 B2 | 6/2005 | Kizer et al. |
| 6,937,081 B2 | 8/2005 | Ishikawa |
| 6,958,634 B2 | 10/2005 | Rashid |
| 7,016,452 B2 | 3/2006 | Partsch et al. |
| 7,046,059 B2 | 5/2006 | Kwak |
| 7,081,782 B2 | 7/2006 | Kizer et al. |
| 7,088,159 B2 | 8/2006 | Kwak et al. |
| 7,274,236 B2 | 9/2007 | Lee |
| 7,417,478 B2 | 8/2008 | Kim et al. |
| 7,423,468 B2 | 9/2008 | Cho |
| 7,629,819 B2 | 12/2009 | Kwak et al. |
| 7,671,648 B2 * | 3/2010 | Kwak ............ 327/158 |
| 8,093,937 B2 | 1/2012 | Kwak et al. |
| 8,350,607 B2 * | 1/2013 | Kwak ............ 327/158 |
| 8,421,515 B2 | 4/2013 | Kwak et al. |
| 2007/0030753 A1 | 2/2007 | Kwak |
| 2008/0189568 A1 | 8/2008 | Kwak |
| 2009/0108902 A1 | 4/2009 | Chlipala et al. |
| 2010/0060335 A1 | 3/2010 | Kwak |
| 2010/0134166 A1 | 6/2010 | Kwak |
| 2012/0182059 A1 | 7/2012 | Kwak et al. |
| 2013/0249618 A1 | 9/2013 | Kwak et al. |

* cited by examiner

SYSTEM AND METHOD FOR AN ACCURACY-ENHANCED DLL DURING A MEASURE INITIALIZATION MODE

CROSS-REFERENCE TO RELATED APPLICATIONS

This application is a continuation of U.S. patent application Ser. No. 12/699,638, filed Feb. 3, 2010, U.S. Pat. No. 8,350,607, issued Jan. 8, 2013, which is a continuation of U.S. patent application Ser. No. 11/588,954, filed Oct. 27, 2006, U.S. Pat. No. 7,671,648, issued Mar. 2, 2010. These applications and patents are incorporated by reference herein in their entirety and for all purposes.

TECHNICAL FIELD

This invention relates generally to integrated circuits, and more specifically to enhancing the accuracy of delay line based structures for synchronizing internal and external clock signals.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to clock the commands into the latches. The internal clock signal and external clock must be synchronized to ensure the internal clock signal clocks the latches at the proper times to successfully capture the commands. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. However, with higher frequency clock signals, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result of inherent delays, the commands applied to the memory device may no longer be valid by the time the internal clock signal clocks the latches.

Figure 1:
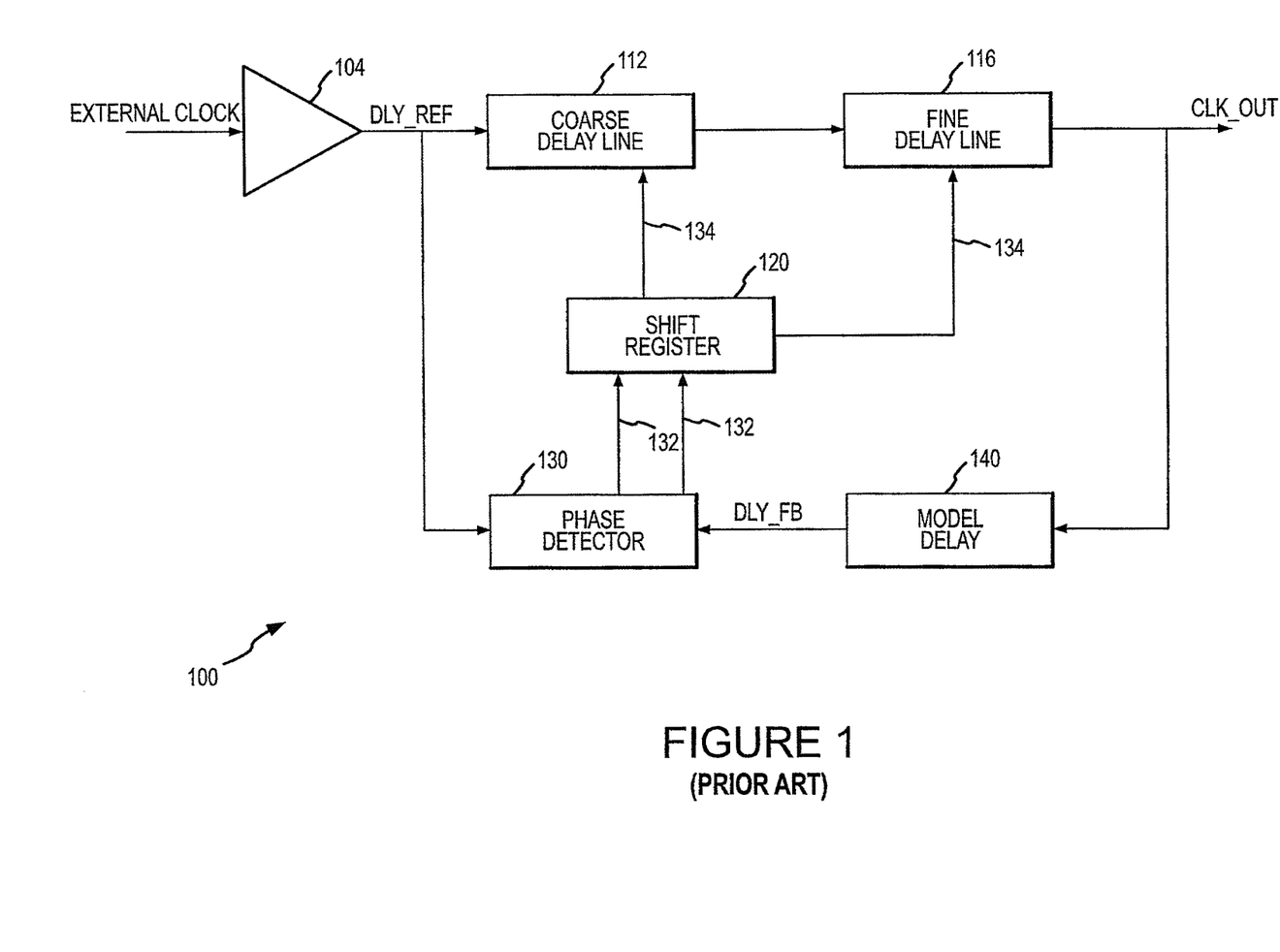
FIG. 1 is a block diagram of a conventional DLL circuit having a model delay circuit.

To synchronize external and internal clock signals in modern synchronous memory devices, a number of different approaches have been considered and utilized, including delay locked loops ("DLLs"), as will be appreciated by those skilled in the art. As used herein, the term synchronized includes signals that are coincident and signals that have a desired delay relative to one another. FIG. 1 illustrates a conventional DLL circuit 100 for providing an approximate delay that closely matches the phase difference between input and output clock signals. The DLL circuit 100 uses a feedback configuration that operates to feed back a phase difference-related signal to control one or more delay lines, such as a coarse delay line 112 or a fine delay line 116, for advancing or delaying the timing of one clock signal to "lock" to a second clock signal.

An external clock signal is initially applied to the DLL circuit 100 and received by an input buffer 104 that provides a buffered clock signal DLY_REF to the DLL circuit 100. The DLY_REF signal is delayed relative to the external clock signal due to a propagation delay of the input buffer 104. The DLY_REF signal is then applied to coarse and fine delay lines 112, 116, which include a number of delay stages that are selected by a shift register 120 to apply a measured delay for adjusting the phase of the DLY_REF signal. The shift register 120 controls adjustments to the coarse and fine delay lines 112, 116 by providing shift control signals 134 in response to receiving control signals from a phase detector 130. In response to the shift control signals 134, the coarse delay line 112 applies a measured delay to adjust the phase of the DLY_REF signal near the desired phase for achieving the phase lock condition. The fine delay line 116 provides smaller delay adjustments to "fine tune" the DLY_REF signal closer to the desired phase lock condition. The coarse and fine delay lines 112, 116 generate an output signal CLK_OUT, whose phase is compared to the DLY_REF signal to determine whether the locking condition has been achieved. The CLK_OUT signal is provided to a model delay circuit 140 that duplicates inherent delays added to the applied external clock signal as it propagates through the delay loop, such as the input buffer 104 The model delay circuit 140 then provides a feedback signal DLY_FB to the phase detector 130. The phase detector 130 compares the phases of the DLY_REF signal and the DLY_FB signal to generate shift selection signals 132 to the shift register 120 to control the coarse or fine delay lines 112, 116. The shift selection signal instructs the shift register 120 to increase the delay of the coarse or fine delay lines 112, 116 when the DLY_FB signal leads the DLY_REF signal, or decrease the delay in the opposite case.

While the conventional DLL circuit 100 may adequately provide delay adjustments using the fine and coarse delay lines 112, 116, it is not without drawbacks. The DLL circuit 100 may take several cycles of the DLY_REF signal propagating through the coarse and fine delay lines 112, 116, making several attempts to properly adjust the DLY_REF signal before a locking condition is found, thereby further delaying the overall operation of the memory device. At higher clock frequencies, the DLL circuit 100 may not adequately control the coarse delay line 112, resulting in overcompensated adjustments. In such case, the DLL circuit 100 is required to restart the locking sequence, causing further delays and mismatched clock signals. For example, when the input and output clock signals are out of phase, the signal skew increases, resulting in faulty data transfers and undesired delays until the DLL circuit 100 locks again.

Other DLL circuits have been designed where the delay-locked loop is preset by a measurement function during an initialization mode. The phases of the internal and external clocks are placed in close proximity to each other by a predetermined delay adjustment during the initialization mode, thereby speeding up the locking time. However, DLL circuits that include initialization modes rely on additional circuitry, such as extra model delay circuits, switches and other logic components for measuring the predetermined delay. Inclusion of excess circuitry, adds further delays to the overall operation of the DLL circuit, utilizing more chip space and consuming more power. Furthermore, when model delay circuits are included for replicating delays within the delay loop, an exact delay match is rarely achieved due to design limitations of matched components as is known in the art. Mismatched delays generally result in the clock signals being out of phase and affect the DLL circuit's ability to achieve an accurate phase lock condition as described above.

Therefore, there is a need for a DLL circuit that more accurately achieves a faster locking state, and that reduces the use of excess circuitry, thereby reducing the overall size of the circuit and the consumption of power and space.

DETAILED DESCRIPTION

Embodiments of the present invention are directed to DLL circuits capable of enhancing the accuracy of delay line based structures by utilizing a measure initialization mode for synchronizing internal and external clock signals. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 2:
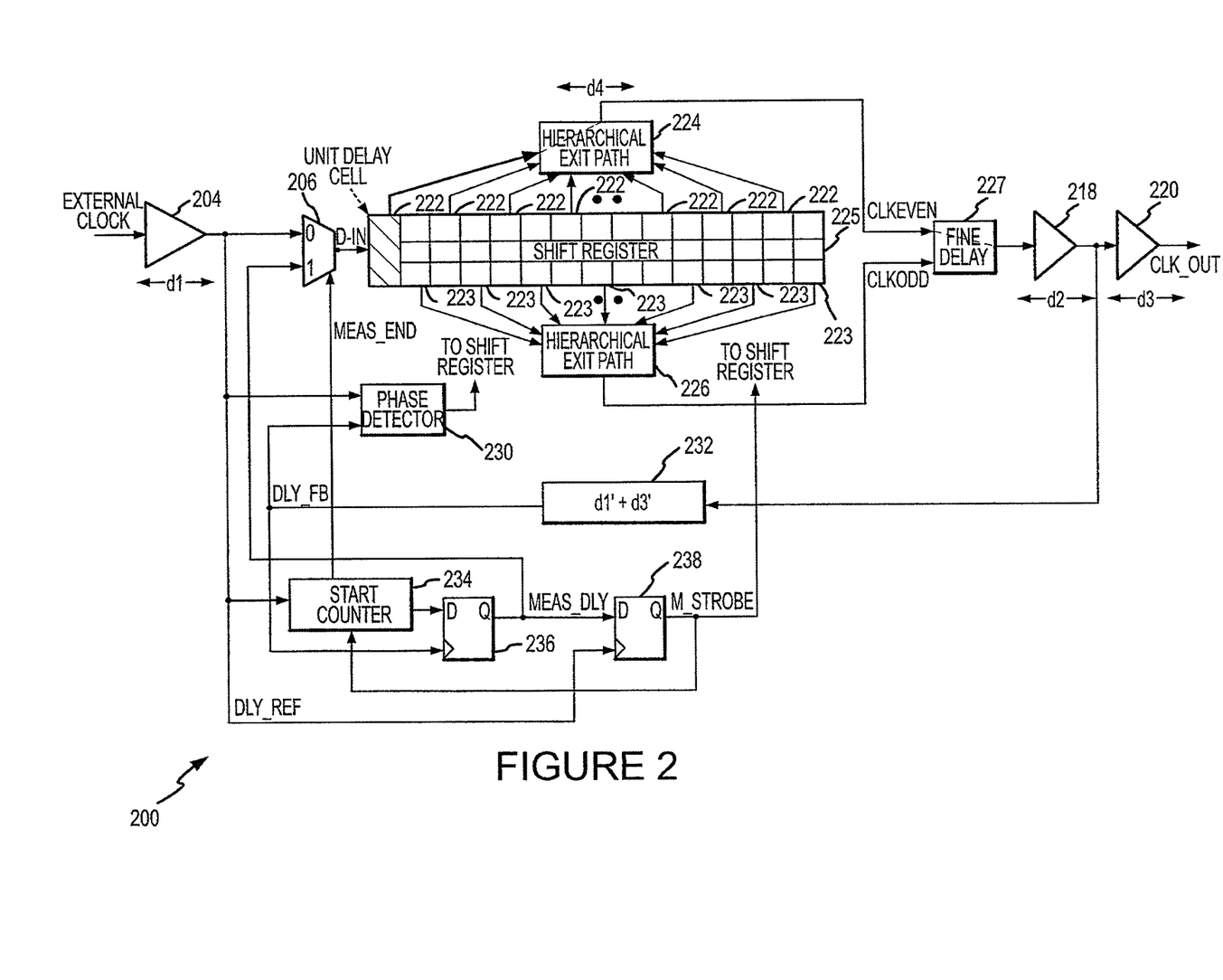
FIG. 2 is a block diagram of a DLL circuit according to an embodiment of the invention.

FIG. 2 shows a block diagram of a DLL circuit 200 whose operation includes a measure initialization mode for initializing a measurement function for adjusting the phase difference between external and internal clock signals, thereby achieving a faster "phase locking state." As in the DLL circuit 100, the DLL circuit 200 uses a feedback configuration that operates to feed back a phase difference-related signal for controlling one or more delay lines to advance or delay the timing of one clock signal until its rising edge is "locked" with the rising edge of a second clock signal. Similar to the DLL circuit 100, an external clock signal is applied to the DLL circuit 200 and received by an input buffer 204 that provides a buffered clock signal DLY_REF to the DLL circuit 200. The DLY_REF signal is delayed <-d1-> relative to the external clock signal due to a propagation delay of the input buffer 204.

The DLL circuit 200 uses a control signal MEAS_END to initialize and control when the system is in a measure initialization mode or when to transition into normal operation mode. After each reset of the system, the MEAS_END signal is initially set to LOW allowing a multiplexer 206 to couple the received DLY_REF signal to the coarse delay line 222, 223, and the system is placed in the measure initialization mode. The DLL circuit 200 may be reset by an external control logic block (not shown) or by an internal component such as a start counter circuit 234, which will be further described in later sections. With each reset of the DLL circuit 200, the coarse delay line 222, 223 is also reset to provide the smallest possible delay during the measure initialization phase, which may be the first unit delay cell of the coarse delay line 222, 223. The coarse delay line 222, 223 is set to a minimum delay at the start of the initialization mode to directly apply on the propagating clock signal any inherent delays, such as a delay <-d4-> from a hierarchical exit path 224, to initialize the measurement function. The multiplexer 206 receives the DLY_REF signal as the input to "0", and the signal DLY_REF is propagated through the minimum delay setting. The multiplexer 206 generates an inverted input signal D_IN relative to the received DLY_REF, the relevancy of which will be further described in the next section. The D_IN signal is then provided by the coarse delay line 222, 223 through the hierarchical exit path 224, 226 and propagated through the fine delay line 227 with very minimal or no additional delays. The hierarchical exit path 224 applies an additional delay <-d4-> to the signal as it exits the delay line 222, 223 at a predetermined adjustment point. In previous designs, separate model delay circuits were used to apply the inherent delays, such as the delay <-d4-> of the hierarchical exit path 224. The D_IN signal is then propagated through the output buffers 218 and 220 to generate a CLK_OUT signal.

Similar to the DLL circuit 100, a DLY_FB signal is generated in a feedback loop after the D_IN signal has propagated through the fine delay line 227 and the first output buffer 218, thereby returning the output signal to be sampled by the phase detector 230 to compare to the input signal phase. The DLY_FB signal is propagated through a model delay 232 that is designed to minimally apply a delay d1'+d3' to compensate for the <-d1-> delay of the input buffer 204 and <-d3-> delay of the output buffer 220. The DLY_FB signal is then propagated directly to a first D flip-flop 236 to generate control signals for starting a delay measurement, which will be described next.

During the measure initialization mode, two D flip-flops 236, 238 are used to calculate a delay measurement that relies on the phase difference between the DLY_REF signal and the initialized DLY_FB signal, in order to obtain a faster locking state. A start counter circuit 234 receives the DLY_REF signal and counts several cycles at the beginning to allow the circuit to stabilize. Once the counts are complete to ensure a stable signal, the start counter circuit 234 transitions a LOW signal at the "D" input of the first D flip-flop 236 to HIGH and transitions the MEAS_END signal to HIGH to begin measuring a delay. Once the D-input transitions HIGH, the first D flip-flop 236 generates a measure pulse control signal MEAS_DLY (also HIGH) clocked by the received DLY_FB signal to start measuring the delay adjustment, and provides the MEAS_DLY signal to the "1" input of the multiplexer 206. The multiplexer 206 selects the received MEAS_DLY signal instead of the DLY_REF signal, and converts it to the inverted D_IN signal for propagating through the coarse delay line 222, 223 once again. The MEAS_DLY signal is also provided to a second D flip-flop 238 for generating a stop measuring control signal M_STROBE. The second D flip-flop 238 receives the MEAS_DLY signal as a HIGH signal to its "D" input from the output of the first D flip-flop 236. The second D flip-flop 238 samples the received HIGH MEAS_DLY signal to transition the M_STROBE signal HIGH, which is clocked by the DLY_REF signal. The M_STROBE signal is provided to a shift register 225, which then instructs the coarse delay line 222, 223 to stop measuring the delay adjustment. The HIGH M_STROBE signal is additionally provided to the start counter circuit 234, which transitions the MEAS_END signal LOW, and places the system in normal operation mode. During normal operation, the coarse delay line 222, 223 is set to provide the measured delay adjustment from the measure initialization operation. Therefore, a faster locking state is achieved for clock signals during normal operation by the preset coarse delay line 222, 223.

The system remains in normal operation until the DLL circuit 200 is once again reset by the start counter 234 or an external control logic block (not shown). During normal operation, the multiplexer 206 once again receives the DLY_REF signal as the input to "0". The multiplexer 206 propagates the inverted D_IN signal through the coarse delay line 222, 223. The delay measurement calculated during the measure initialization mode is applied to provide the proper delay adjustment to the D_IN signal for "locking," as previously described. After the adjusted delay is applied to the coarse delay line 222, 223, the adjusted signal is propagated through the hierarchical exit path 224 or 226 to be received by the fine delay line 227. The adjusted signal has now been optimally compensated for the <-d4-> delay due to direct use of the coarse delay line 222, 223 during the measure initialization operation.

Additionally, the DLL circuit 200 is designed with two possible pathway for the coarse and fine delay lines 222, 223, 227. If the calculated delay measurement requires an even number of unit delay stages, the D_IN signal passes through the coarse delay line 222 to the hierarchical exit path 224, which generates a CLKEVEN signal to the fine delay line 227. The fine delay line 227 is designed to provide an output signal having a phase variation from the input signal that is substantially smaller than the signal variation provided by the coarse delay lines 222, 223 to its output signal. If the delay measurement requires an odd number of unit delay stages, the D_IN signal is propagated through the coarse delay line 223 to the hierarchical exit path 226 instead. The hierarchical exit path 226 provides a CLKODD signal to the fine delay line 227. An embodiment of the fine and coarse delay lines 222, 223, 227 are described in detail in commonly assigned patent application Ser. No. 11/186,548 (filing date Jul. 21, 2005) entitled SEAMLESS COARSE AND FINE DELAY STRUCTURE FOR HIGH PERFORMANCE DLL, hereby incorporated by reference.

The adjusted output signal is then passed on to the output buffers 218, 220 to generate the output signal CLK_OUT. In addition, as previously described, the output signal is again returned to the phase detector 230 as the feedback signal DLY_FB after propagating through the buffer 218. During normal operation, the phase detector 230 compares the phases of the DLY_REF signal and the DLY_FB signal to provide a shift selection signal to the shift register 225. In response to the shift selection signal, the shift register 225 makes fine adjustments to the coarse delay lines 222, 223. The phase detector 230 may also be designed to provide a shift selection signal to the shift register (not shown) coupled to the fine delay lines 227. The shift selection signal instructs the shift register 225 to increase the delay of the coarse delay lines 222, 223 when the DLY_FB signal leads the DLY_REF signal, or decrease the delay in the opposite case. However, due to the preset adjustments of the measure initialization mode of operation of the DLL circuit 200, the phase of the DLY_REF and DLY_FB signals will be locked or close to locking at a faster rate, thereby reducing the need for any significant adjustments by the phase detector 230 and the shift register 225.

The calculation of the measure pulse MEAS_DLY will now be summarized. The sum of the delays allocated by the closed loop of the DLL circuit 200 from the DLY_REF signal to the DLY_FB signal $N*tCK_{FB}$, where N is an integer and tCK is the clock period, can be represented by the equation $N*tCK_{FB}$=(measured delay)+d4+d2+d1'+d3'. Therefore, by rearranging the $N*tCK_{FB}$ equation the measured delay is derived and represented by the equation measure delay=$N*tCK_{FB}$−(d4+d2+d1'+d3'). The total delay allocation of the delay loop in the DLL circuit 200 (applied to the external clock signal) can be represented as $N*tCK_{REF}$=d1+(measured delay)+d4+d2+d3. The two signals are "locked" when $N*tCK_{FB} \approx N*tCK_{REF}$ and is represented by an equation d1+[$N*tCK_{FB}$−(d4+d2+d1'+d3')]+d4+d2+d3≈$N*tCK_{REF}$. Therefore, the locking state is best achieved when the sum of delay elements (d4+d2+d1'+d3') from the $N*tCK_{FB}$ equation are accurately matched to the sum of delay elements (d4+d2+d1+d3) from the $N*tCK_{REF}$ equation. The d1, d2, and d3 delays are the result of input or output buffers, which are easier to match. However, the d4 delay is an inherent delay due to the hierarchical exit path 224, 226. Such delays have previously been matched by incorporating a separate model circuit to the DLL circuit 200. However, separate model delays have difficulty achieving an exact delay match due to design limitations of matched components as previously described. According to the present invention, a better delay match is achieved if the original circuit path that provides the delay <-d4-> is used. By propagating the D_IN signal directly through the coarse delay line 222, 223 during the measure initialization mode (to initialize the measuring signal), the DLL circuit 200 applies the same <-d4-> delay as it would apply during normal operation. The accuracy of obtaining a locking point between the external and internal clock signals is significantly enhanced as shown by the equation d1+[$N*tCK_{FB}$−(d4+d2+d1'+d3')]+d4+d2+d3≈$N*tCK_{REF}$, if the delay <-d4-> for the $N*tCK_{FB}$ and the $N*tCK_{REF}$ are properly matched, thereby providing better matched signals where $N*tCK_{FB}$ $N*tCK_{REF}$.

Figure 3:
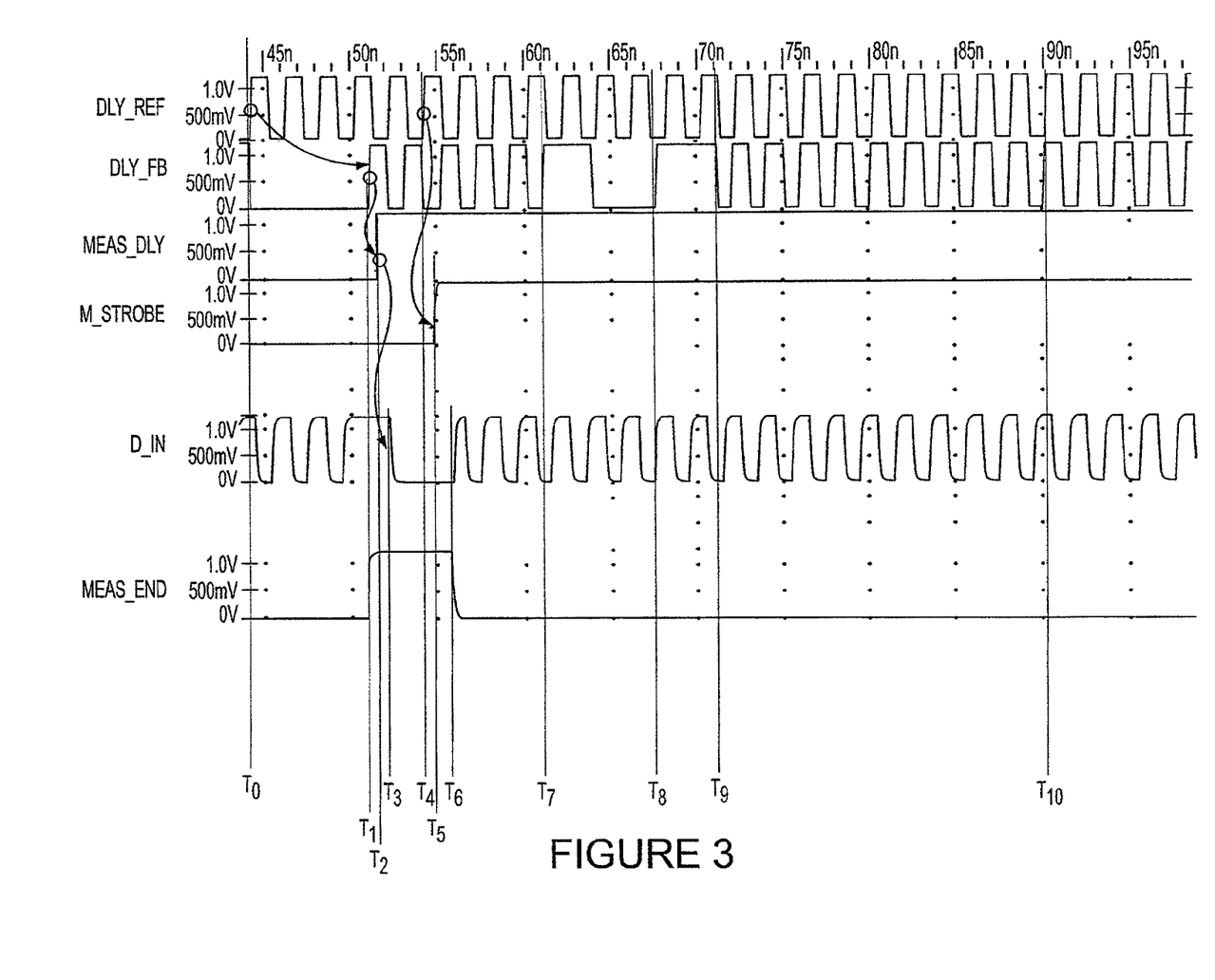
FIG. 3 is a timing diagram of various signals during operation of the DLL circuit according to an embodiment of the invention of FIG. 2.

Clock signals for the DLL circuit 200 during operation of the measure initialization mode are shown in FIG. 3. Each signal shown in FIG. 3 corresponds to signals labeled in FIG. 2. A sampling of the DLY_REF signal is shown, which has been delayed relative to the external clock signal due to the propagation delay of the input buffer 204 at time T0. The D_IN signal generated by the multiplexer 206 in response to receiving the DLY_REF signal is shown as being complementary to the DLY_REF signal at time T0, due to the inverting multiplexer 206. Also at time T0, the MEAS_END signal is shown having an initial value being LOW. After some delay (including d4, d2, and d1'+d3'), as the D_IN signal is propagated through the delay loop, the DLY_FB signal is generated at time T1 responsive to the rising edge of the DLY_REF signal at time T0. Also at time T1, the MEAS_END signal is transitioned HIGH by the start counter circuit 234, which initiates the delay measure command and further causes the multiplexer 206 to provide the MEAS_DLY signal as the D_IN signal. Shortly thereafter at time T2, the MEAS_DLY signal is transitioned HIGH in response to the rising edge of the DLY_Fb signal. The D_IN signal transitions LOW in response to the rising edge of the MEAS_DLY signal at time T3 to begin measuring the delay. After some measured delay, the second D flip-flop 238 generates a control signal M_STROBE that transitions HIGH at time T5 in response to the rising edge of the DLY_REF signal at time T4. The HIGH M_STROBE signal is received by the shift register 225 to control the coarse delay lines 222, 223 and is also received by the start counter circuit 234. In response, the shift registers stop measuring the delay and the MEAS_END signal transitions LOW at time T6 to initiate normal operation of the DLL circuit 200. A measured pulse is generated having a time width that is the same as the delay time between the rising edge of the MEAS_DLY signal at time T2 and the rising edge of the M_STROBE signal at time T5. At time T6, due to the MEAS_END signal, the multiplexer 206 switches to provide the DLY_REF signal as the D_IN signal. The DLY_FB signal responds to the changes in the D_IN signal waveform and after some delay between times T6 and T7, the DLY_FB signal follows the D_IN signal. The measured pulse in the D_IN signal also appears in the DLY_FB signal between times T8 and T9. As a result of the delay due to the measured pulse, the DLY_REF signal and the DLY_FB signal are locked, indicated by the rising edges of both signals matched at time T10.

Figure 4:
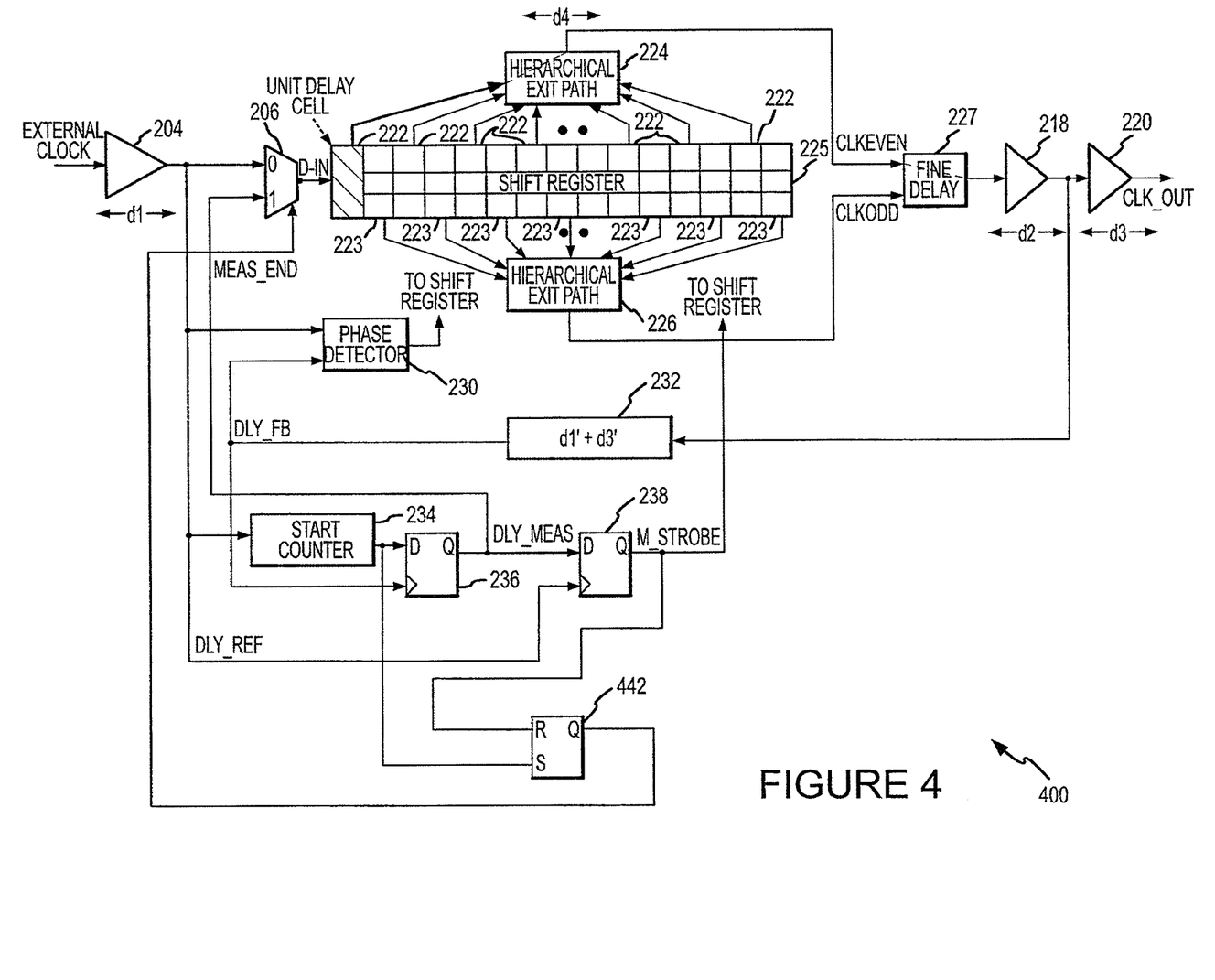
FIG. 4 is a block diagram of a DLL circuit according to another embodiment of the invention.

An alternate embodiment of the invention is shown in FIG. 4, utilizing an SR flip-flop 442 in a DLL circuit 400. The DLL circuit 400 functions in essentially the same manner as the DLL circuit 200 of FIG. 2, and in the interest of brevity comparable components and functionality will not be described. As previously described, the DLL circuits 200, 400 may be reset by an external control logic block or by an internal component. In one embodiment, the DLL circuit 400 may include the SR flip-flop 442 to control the MEAS_END signal. The start counter circuit 234 may additionally provide an input signal to the S input of the SR flip-flop 442, to generate a HIGH output MEAS_END signal. The second D flip-flop 238 may additionally provide the M_STROBE signal to the R input of the SR flip-flop 442 to reset the MEAS_END signal to LOW after the locking delay is measured.

Figure 5:
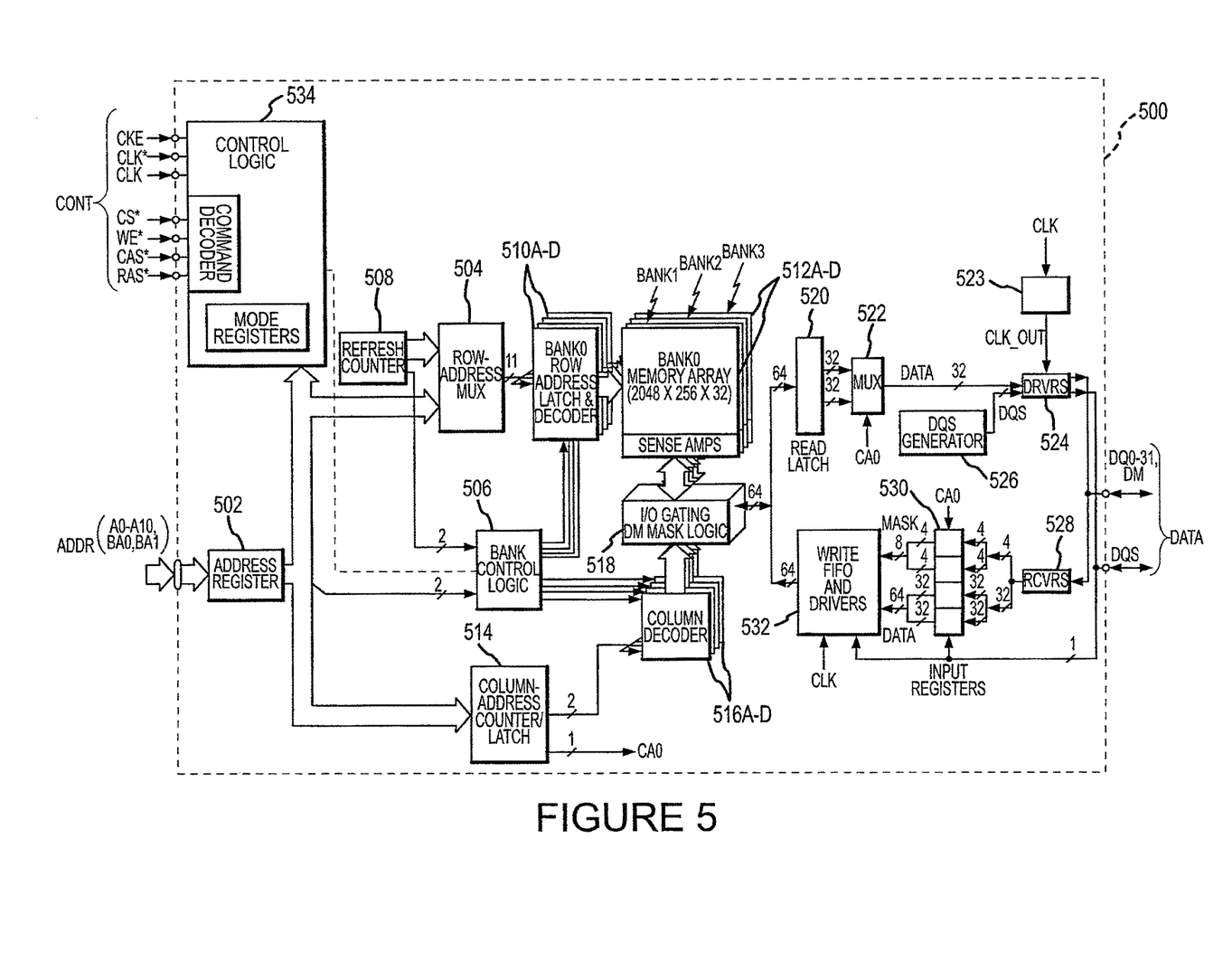
FIG. 5 is a functional block diagram illustrating a memory device including a DLL circuit according to an embodiment of the invention.

FIG. 5 is a functional block diagram of a memory device 500 including a clock generator 523 according to an embodiment of the invention. The memory device 500 in FIG. 5 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 500 includes an address register 502 that receives row, column, and bank addresses over an address bus ADDR, with a memory controller (not shown) typically supplying the addresses. The address register 502 receives a row address and a bank address that are applied to a row address multiplexer 504 and bank control logic circuit 506, respectively. The row address multiplexer 504 applies either the row address received from the address register 502 or a refresh row address from a refresh counter 508 to a plurality of row address latch and decoders 510A-D. The bank control logic 506 activates the row address latch and decoder 510A-D corresponding to either the bank address received from the address register 502 or a refresh bank address from the refresh counter 508, and the activated row address latch and decoder latches and decodes the received row address. In response to the decoded row address, the activated row address latch and decoder 510A-D applies various signals to a corresponding memory bank 512A-D to thereby activate a row of memory cells corresponding to the decoded row address. Each memory bank 512A-D includes a memory-cell array having a plurality of memory cells arranged in rows and columns, and the data stored in the memory cells in the activated row is stored in sense amplifiers in the corresponding memory bank. The row address multiplexer 504 applies the refresh row address from the refresh counter 508 to the decoders 510A-D and the bank control logic circuit 506 uses the refresh bank address from the refresh counter when the memory device 500 operates in an auto-refresh or self-refresh mode of operation in response to an auto- or self-refresh command being applied to the memory device 500, as will be appreciated by those skilled in the art.

A column address is applied on the ADDR bus after the row and bank addresses, and the address register 502 applies the column address to a column address counter and latch 514 which, in turn, latches the column address and applies the latched column address to a plurality of column decoders 516A-D. The bank control logic 506 activates the column decoder 516A-D corresponding to the received bank address, and the activated column decoder decodes the applied column address. Depending on the operating mode of the memory device 500, the column address counter and latch 514 either directly applies the latched column address to the decoders 516A-D, or applies a sequence of column addresses to the decoders starting at the column address provided by the address register 502. In response to the column address from the counter and latch 514, the activated column decoder 516A-D applies decode and control signals to an I/O gating and data masking circuit 518 which, in turn, accesses memory cells corresponding to the decoded column address in the activated row of memory cells in the memory bank 512A-D being accessed.

During data read operations, data being read from the addressed memory cells is coupled through the I/O gating and data masking circuit 518 to a read latch 520. The I/O gating and data masking circuit 518 supplies N bits of data to the read latch 520, which then applies two N/2 bit words to a multiplexer 522. The circuit 518 provides 64 bits to the read latch 520 which, in turn, provides two 32 bits words to the multiplexer 522. A data driver 524 sequentially receives the N/2 bit words from the multiplexer 522 and also receives a data strobe signal DQS from a strobe signal generator 526 and a delayed clock signal CLK_OUT from the clock generator 523. The DQS signal is used by an external circuit such as a memory controller (not shown) in latching data from the memory device 500 during read operations. In response to the delayed clock signal CLK_OUT, the data driver 524 sequentially outputs the received N/2 bits words as a corresponding data word DQ, each data word being output in synchronism with rising or falling edges of the CLK signal that is applied to clock the memory device 500. The data driver 524 also outputs the data strobe signal DQS in synchronism with rising or falling edges of the CLK signal. Each data word DQ and the data strobe signal DQS collectively define a data bus DATA. As will be appreciated by those skilled in the art, the CLK_OUT signal from the DLL is a delayed version of the signal CLK signal, and the clock generator 523 adjusts the delay of the CLK_OUT signal relative to the signal CLK to ensure that the DQS signal and the DQ words are placed on the DATA bus in synchronism with the CLK signal, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 528 receives each DQ word and the associated DM signals, and applies these signals to input registers 530 that are clocked by the DQS signal. In response to a rising edge of the DQS signal, the input registers 530 latch a first N/2 bit DQ word and the associated DM signals, and in response to a falling edge of the DQS signal the input registers latch the second N/2 bit DQ word and associated DM signals. The input register 530 provides the two latched N/2 bit DQ words as an N-bit word to a write FIFO and driver 532, which clocks the applied DQ word and DM signals into the write FIFO and driver in response to the DQS signal. The DQ word is clocked out of the write FIFO and driver 532 in response to the CLK signal, and is applied to the I/O gating and masking circuit 518. The I/O gating and masking circuit 518 transfers the DQ word to the addressed memory cells in the accessed bank 512A-D subject to the DM signals, which may be used to selectively mask bits or groups of bits in the DQ words (i.e., in the write data) being written to the addressed memory cells.

A control logic and command decoder 534 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signal CLK or the combination of clock signals CLK, CLK*, the command decoder 534 latches and decodes an applied command, and generates a sequence of clocking and control signals that control the components 502-532 to execute the function of the applied command. The clock enable signal CKE enables clocking of the command decoder 534 by the clock signal CLK or clock signals CLK, CLK*. The command decoder 534 latches command and address signals at edges of the CLK signal or CLK and CLK* signals (i.e., the crossing point of CLK going high and CLK* going low), while the input registers 530 and data drivers 524 transfer data into and from, respectively, the memory device 500 in response to the edges of the data strobe signal DQS and thus at the frequency of the clock signal CLK or clock signals CLK, CLK*. This is true because the DQS signal has the same frequency as the clock signals. The memory device 500 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 534 in generating the control and timing signals is conventional, and thus, for the sake of brevity, will not be described in more detail.

Figure 6:
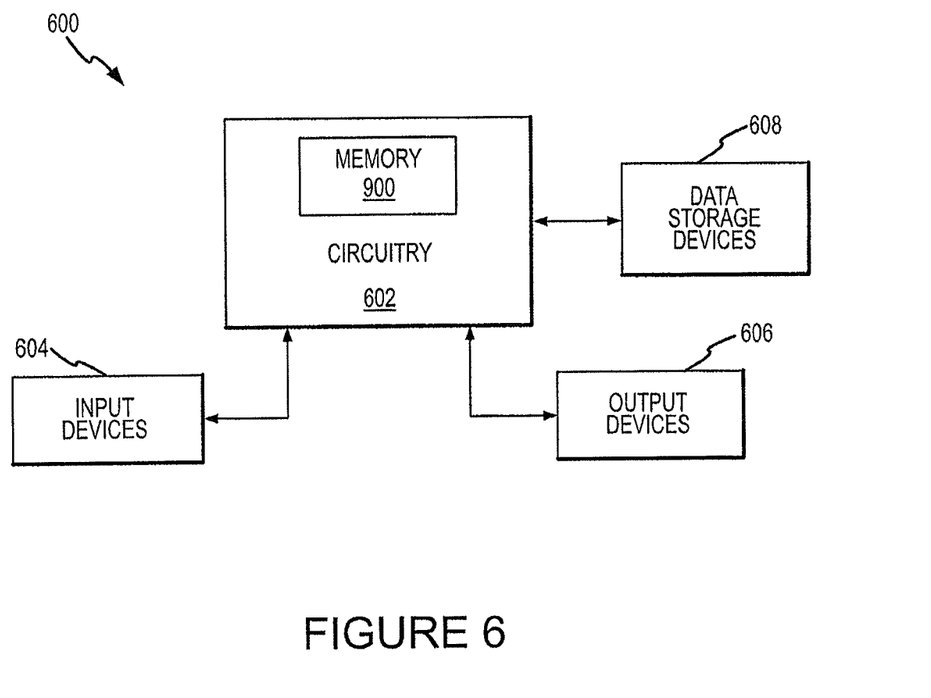
FIG. 6 is a functional block diagram illustrating a computer system including the memory device of FIG. 5.

FIG. 6 is a block diagram of a processor-based system 600 including processor circuitry 602, which includes the memory device 500 of FIG. 5. Typically, the processor circuitry 602 is coupled through address, data, and control buses to the memory device 500 to provide for writing data to and reading data from the memory device. The processor circuitry 602 includes circuitry for performing various processing functions, such as executing specific software to perform specific calculations or tasks. In addition, the processor-based system 600 includes one or more input devices 604, such as a keyboard or a mouse, coupled to the processor circuitry 602 to allow an operator to interface with the processor-based system 600. Typically, the processor-based system 600 also includes one or more output devices 606 coupled to the processor circuitry 602, such as output devices typically including a printer and a video terminal. One or more data storage devices 608 are also typically coupled to the processor circuitry 602 to store data or retrieve data from external storage media (not shown). Examples of typical storage devices 608 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. An apparatus, comprising:
an adjustable delay circuit having an input to which an input clock signal is applied, and an output at which an output clock signal is provided, the output clock signal being delayed relative to the input clock signal by an adjustable delay; and
a delay control circuit, comprising:
a phase detector having a first input configured to receive the input clock signal and a second input configured to receive the output clock signal, the phase detector configured to determine the phase difference between the output clock signal and the input clock signal, and to vary the adjustable delay; and
a delay measurement circuit configured to receive the input clock signal and the output clock signal, the delay measurement circuit operable in a delay measurement mode to measure a delay, at least in part, by providing a measurement signal to the input of the adjustable delay circuit and measuring a delay associated with the measurement signal and a corresponding output signal, the delay measurement circuit further operable to set the adjustable delay of the adjustable delay circuit according to the measured delay.

2. The apparatus of claim 1, wherein the delay control circuit comprises:
a shift register coupled to a plurality of delay units and the phase detector, the shift register configured to provide a shift selection signal to the plurality of delay units to increase or decrease the number of delay units through which the input signal is delayed.

3. The apparatus of claim 2, wherein the adjustable delay circuit comprises an exit path coupled to the plurality of delay units and configured to provide the output clock signal from a delay unit selected by the measurement signal.

4. The apparatus of claim 1, further comprising:
a multiplexer configured to provide the measurement signal to the adjustable delay when the delay measurement circuit is operating in the delay measurement mode and to provide the input clock signal when the delay measurement circuit is not operating in the delay measurement mode.

5. The apparatus of claim 1, wherein the delay control circuit comprises:

a model delay configured to receive the output signal and delay the output signal based, at least in part, on the propagation delay of an input buffer.

6. The apparatus of claim 1, wherein the adjustable delay circuit comprises:
a first exit path coupled to a first plurality of delay stages and configured to receive a first delayed input clock signal from one of the first plurality of delay stages based, at least in part, on the adjustable delay; and
a second exit path coupled to a second plurality of delay stages and configured to receive a second delayed input, clock signal from one of the second plurality of delay stages based, at least in part, on the adjustable delay,
wherein the first delayed input clock signal comprises the input clock signal delayed by a first course delay and the second delayed input clock signal comprises the input clock signal delayed by a second coarse delay.

7. The apparatus of claim 1, wherein the phase detector is configured to provide a shift select signal to the adjustable delay circuit and wherein the adjustable delay circuit is configured to make one or more fine delay adjustments to the input clock signal based, at least in part, on the shift select signal.

8. An apparatus, comprising:
a variable delay line configured to delay a signal with a variable delay to provide a delayed signal;
a phase detector configured to receive the delayed signal from the variable delay line and determine a phase difference between the delayed signal and a clock signal, the phase detector further configured to adjust the variable delay based, at least in part, on the phase difference; and
a delay measurement circuit configured to provide a measurement signal to the variable delay line in a delay measurement mode, the delay measurement circuit further configured to determine a measured delay based, at least in part, on a delay applied to the measurement signal and adjust the variable delay based, at least in part, on the measured delay.

9. The apparatus of claim 8, wherein the delay measurement circuit comprises:
a start counter configured to receive the clock signal and to count a plurality of cycles of the clock signal, the start counter further configured to provide an initialization control signal responsive, at least in part, to counting a particular number of cycles of the clock signal,
wherein the delay measurement circuit is further configured to provide the measurement signal responsive, at least in part, to the initialization control signal.

10. The apparatus of claim 8, wherein the variable delay line comprises a plurality of delay stages and wherein the delay measurement circuit is configured to adjust the variable delay by adjusting a number of delay stages through which the input clock signal is propagated.

11. The apparatus of claim 10, wherein the variable delay line is configured to provide the delayed, signal to a first exit path responsive, at least in part, to the number of delay stages comprising an odd number of delay stages and to provide the delayed signal to a second exit path responsive, at least in part, to the number of delay stages comprising an even number of delay stages.

12. The apparatus of claim 8, wherein the variable delay line comprises:
a shift register configured to receive a shift selection signal from the delay measurement circuit when the delay measurement circuit is in the delay measurement mode and to receive a shift selection signal from the phase detector when the delay measurement circuit is not in the delay measurement mode.

13. The apparatus of claim 8, wherein the delay measurement circuit is configured to exit the delay measurement mode responsive, at least in part, to a stop control signal.

14. A method, comprising:
initializing a delay measurement mode for a delay adjustment circuit;
measuring, a delay applied to a measure control signal; and
applying the measured delay to an input clock signal to generate an output clock signal with a phase synchronized to the phase of the input clock signal.

15. The method of claim 14, wherein applying the measured delay comprises:
selectively providing the input clock signal to each of a plurality of delay stages.

16. The method of claim 14, wherein said initializing composes:
initializing, the delay measurement mode responsive, at least in part, to counting a number of clock cycles of the input clock signal.

17. The method of claim 14, further comprising:
delaying the measure control signal based, at least in part, on the propagation delay of an input buffer.

18. The method of claim 14, wherein said initializing a delay measurement mode for a delay adjustment circuit comprises:
providing a measure pulse control signal to a multiplexer; and
providing the measure control signal to a variable delay line responsive, at least in part, to the measure pulse control signal.

19. The method of claim 14, further comprising:
providing a shift selection signal, the shift selection signal based, at least in part, on a phase difference between the input clock signal and the output clock signal.

20. The method of claim 14, further comprising:
transitioning, to a normal mode of operation responsive to a stop control signal.

* * * * *

UNITED STATES PATENT AND TRADEMARK OFFICE
CERTIFICATE OF CORRECTION

| | | |
|---|---|---|
| PATENT NO. | : 8,928,376 B2 | Page 1 of 1 |
| APPLICATION NO. | : 13/736857 | |
| DATED | : January 6, 2015 | |
| INVENTOR(S) | : Jongtae Kwak | |

It is certified that error appears in the above-identified patent and that said Letters Patent is hereby corrected as shown below:

In the Claims

In column 10, lines 63-64, in Claim 4, delete "delay .measurement" and insert -- delay measurement --, therefor.
In column 11, line 11, in Claim 6, delete "input," and insert -- input --, therefor.
In column 11, line 15, in Claim 6, delete "course" and insert -- coarse --, therefor.
In column 12, line 2, in Claim 11, delete "delayed," and insert -- delayed --, therefor.
In column 12, line 23, in Claim 14, delete "measuring," and insert -- measuring --, therefor.
In column 12, lines 31-32, in Claim 16, delete "composes:" and insert -- comprises: --, therefor.
In column 12, line 33, in Claim 16, delete "initializing," and insert -- initializing --, therefor.
In column 12, line 52, in Claim 20, delete "transitioning," and insert -- transitioning --, therefor.

Signed and Sealed this
Twenty-fourth Day of March, 2015

Michelle K. Lee
*Director of the United States Patent and Trademark Office*